United States Patent
Zhou et al.

(10) Patent No.: US 12,183,673 B2
(45) Date of Patent: *Dec. 31, 2024

(54) FUSE CIRCUITS

(71) Applicant: SKYWORKS SOLUTIONS, INC., Irvine, CA (US)

(72) Inventors: Bo Zhou, Acton, MA (US); Guillaume Alexandre Blin, Carlisle, MA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/942,947

(22) Filed: Sep. 12, 2022

(65) Prior Publication Data
US 2023/0085532 A1 Mar. 16, 2023

Related U.S. Application Data

(63) Continuation of application No. 16/861,028, filed on Apr. 28, 2020, now Pat. No. 11,444,026.

(60) Provisional application No. 62/841,482, filed on May 1, 2019.

(51) Int. Cl.
| | | |
|---|---|---|
| *H01L 23/525* | (2006.01) | |
| *G11C 17/16* | (2006.01) | |
| *G11C 17/18* | (2006.01) | |
| *H04B 1/40* | (2015.01) | |

(52) U.S. Cl.
CPC .......... *H01L 23/5256* (2013.01); *G11C 17/16* (2013.01); *G11C 17/18* (2013.01); *H04B 1/40* (2013.01); *H01L 2223/6677* (2013.01)

(58) Field of Classification Search
CPC . G11C 17/16; G11C 17/18; H01L 2223/6677; H01L 23/5256; H04B 1/40
See application file for complete search history.

(56) References Cited

U.S. PATENT DOCUMENTS

| | | | |
|---|---|---|---|
| 7,936,582 B1* | 5/2011 | Zhou | G11C 7/04 365/96 |
| 11,444,026 B2* | 9/2022 | Zhou | H01L 23/5256 |
| 2007/0280012 A1* | 12/2007 | Obayashi | G11C 29/028 257/E27.071 |
| 2008/0137251 A1 | 6/2008 | Lin et al. | |
| 2008/0283963 A1 | 11/2008 | Chung et al. | |
| 2010/0014374 A1* | 1/2010 | Takase | G11C 29/027 365/225.7 |
| 2015/0043265 A1* | 2/2015 | Uvieghara | G11C 17/16 327/437 |
| 2015/0085557 A1* | 3/2015 | Hoefler | G11C 17/16 365/96 |

(Continued)

OTHER PUBLICATIONS

Non-Final Rejection for U.S. Appl. No. 16/861,028, dated Jan. 31, 2022, 10 pages.

(Continued)

*Primary Examiner* — Nguyen T Vo
(74) *Attorney, Agent, or Firm* — Chang & Hale LLP

(57) ABSTRACT

Circuits, methods, and devices for protecting against accidental fuse programming are discussed herein. For example, a fuse circuit may include a fuse, a first switch coupled to a first point and coupled in series with the fuse, and a second switch coupled in series with the fuse between the fuse and a second point.

20 Claims, 9 Drawing Sheets

(56) References Cited

U.S. PATENT DOCUMENTS

| | | | |
|---|---|---|---|
| 2015/0310930 A1* | 10/2015 | Boldt | G11C 17/18 |
| | | | 365/96 |
| 2018/0047670 A1* | 2/2018 | Zhou | H01L 23/49575 |
| 2018/0151240 A1 | 5/2018 | Zhou et al. | |
| 2018/0166143 A1* | 6/2018 | Chih | G11C 17/18 |
| 2018/0336955 A1 | 11/2018 | Zhou et al. | |
| 2019/0027333 A1 | 1/2019 | Zhou | |
| 2019/0081004 A1* | 3/2019 | Fucili | H01L 21/78 |

OTHER PUBLICATIONS

Notice of Allowance for U.S. Appl. No. 16/861,028, dated May 3, 2022, 5 pages.

\* cited by examiner

FUSE CIRCUITS

CROSS-REFERENCE TO RELATED APPLICATION(S)

This application is a continuation of U.S. application Ser. No. 16/861,028, filed Apr. 28, 2020, entitled "Accidental Fuse Programming Protection Circuit," which claims priority to U.S. Provisional Application No. 62/841,482, filed May 1, 2019, entitled "Accidental Fuse Programming Protection Circuit," the entire contents of both are incorporated herein by reference.

The following applications are incorporated herein by reference: U.S. patent application Ser. No. 15/798,739, filed Oct. 31, 2017, entitled "Accidental Fuse Programming Protection Circuits," and U.S. patent application Ser. No. 16/035,701, filed Jul. 15, 2018, entitled "Circuits, Devices and Methods for Programming a Fuse."

BACKGROUND

Field

The present disclosure relates to fuse protection circuits.

Description of the Related Art

In many integrated circuits implemented on semiconductor devices, fuses can be used to store information. For example, fuses can be implemented on a semiconductor die to store information regarding manufacturing of the semiconductor die, information regarding post manufacturing, a unique code associated with security functionality, or any other information.

SUMMARY

In accordance with some implementations, the present disclosure relates to a fuse circuit that includes a first switch electrically connected to a first point, a fuse electrically connected in series with the first switch, a first biasing circuit to control the first switch to enable programming of the fuse in response to a fuse programming event, a second switch electrically connected in series with the fuse between the fuse and a second point, and a second biasing circuit to control the second switch to enable programming of the fuse in response to the fuse programming event.

In some embodiments, the first switch and the second switch each include a field-effect transistor. In some embodiments, the fuse circuit further comprises a conductive path coupled to a gate of the second switch and the second point, the conductive path including a resistor, the conductive path creating a path to bleed current when the second biasing circuit controls the second switch to operate in a non-programming or non-sensing state.

In some embodiment, the fuse circuit further comprises a third switch electrically connected in series with the first switch between the first switch and the fuse, the third switch including a cascode field-effect transistor, the first biasing circuit to control the third switch to enable programming of the fuse in response to the fuse programming event. In some embodiments, the fuse circuit further comprises a fuse protection capacitor coupled to a gate of the third switch and the first point to adjust a bias voltage of the third switch in response to a change in a voltage of the first point relative to a voltage of the second point.

In some embodiments, the fuse circuit further comprises a fuse protection diode electrically connected in series with the first switch between the first point and the fuse. In some embodiments, the first point includes a shared power supply and fuse programming pad and the second point includes a ground pad.

In some embodiments, the fuse circuit further comprises a fuse sensing circuit electrically connected to the fuse, the fuse sensing circuit to detect a state of the fuse in response to a fuse sensing event. In some embodiments, the fuse sensing circuit includes the second biasing circuit, the second biasing circuit to enable a current to flow through the second switch in response to the fuse sensing event.

In some embodiments, the fuse includes a first fuse and the fuse circuit further includes a third switch and a second fuse, the third switch electrically connected in series with the second fuse, the first biasing to control the third switch to enable programming of the second fuse in response to an additional fuse programming event.

In some embodiments, the fuse circuit further comprises a fourth switch electrically connected in series with the second fuse between the second fuse and the second point, the second biasing circuit to control the fourth switch to enable programming of the second fuse in response to the additional fuse programming event. In some embodiments, the first and second fuses are electrically connected to a node and the second switch is electrically connected between the node and the second pad.

In some embodiments, the first switch includes a P-type field-effect transistor and the second switch includes an N-type field-effect transistor.

In some implementations, the present disclosure relates to a packaged module that includes a packaging substrate and a fuse circuit implemented on the packaging substrate. The fuse circuit includes a first switch, a fuse, a first biasing circuit, a second switch, and a second biasing circuit. The first switch is electrically connected to a first point and the fuse is electrically connected in series with the first switch. The first biasing circuit is configured to control the first switch to enable programming of the fuse based at least in part on a fuse programming event. The second switch is electrically connected in series with the fuse between the fuse and a second point. The second biasing circuit is configured to control the second switch to enable programming of the fuse based at least in part on the fuse programming event.

In some embodiments, the first switch and the second switch each include a field-effect transistor. In some embodiments, the fuse circuit further includes a conductive path coupled to a gate of the second switch and the second point, the conductive path including a resistor. In some embodiments, the first point includes a shared power supply and fuse programming pad and the second point includes a ground pad.

In some implementations, the present disclosure relates to a radio-frequency device including memory, a transceiver in communication with the memory, the transceiver to generate a radio-frequency signal, a front end system in communication with the transceiver, the front end system to amplify the radio-frequency signal, a power management system in communication with the transceiver, the power management system to provide power for operation of the radio-frequency device, a fuse circuit implemented on a least one of the memory, the transceiver, the front end system, or the power management system, and an antenna in communication with the front end system, the antenna to transmit the amplified radio-frequency signal. The fuse circuit includes a first switch, a fuse, a first biasing circuit, a second switch, and a second biasing circuit. The first switch is electrically connected to a first point and the fuse is electrically connected in series with the first switch. The first biasing circuit is configured to control the first switch to enable programming of the fuse based at least in part on a fuse programming event. The second switch is electrically connected in series with the fuse between the fuse and a second point. The second biasing circuit is configured to control the second switch to enable programming of the fuse based at least in part on the fuse programming event.

In some embodiments, the fuse circuit further includes a conductive path coupled to a gate of the second switch and the second point. In some embodiments, the first point includes a shared power supply and fuse programming pad and the second point includes a ground pad.

For purposes of summarizing the disclosure, certain aspects, advantages, and/or features of the disclosure have been described. It is to be understood that not necessarily all such advantages may be achieved in accordance with any particular embodiment of the disclosure. Thus, the disclosure may be embodied or carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of the disclosure. In addition, various features of different disclosed embodiments can be combined to form additional embodiments, which are part of this disclosure. Throughout the drawings, reference numbers may be reused to indicate correspondence between reference elements.

DETAILED DESCRIPTION

Figure 1:
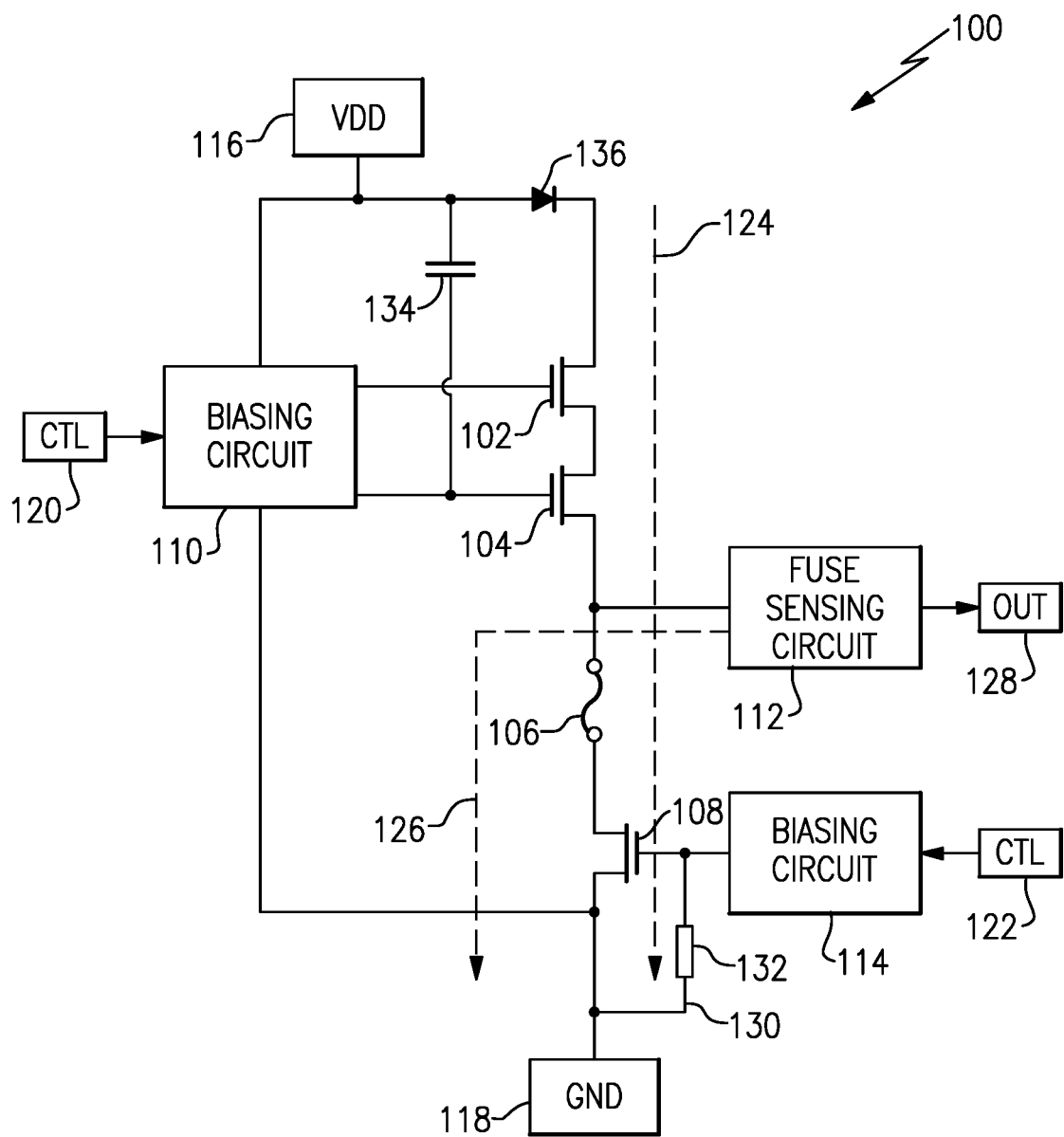
FIG. 1 illustrates an example fuse system that protects against accidental fuse programming in accordance with one or more embodiments.

Fuses can be used in a variety of contexts to store information. In examples, data from a fuse is used to compensate a semiconductor die for variations arising from manufacturing. To store data in a fuse, a relatively high current is provided to the fuse to "blow" the fuse or otherwise change the resistance of the fuse. Such storing is often referred to as fuse programming. To read data, a current or voltage is provided to sense a resistance of the fuse.

In some cases, a fuse is subjected to an undesired current or voltage change, causing the fuse to be inadvertently programmed. Such accidental programming can result from power supply transients, such as rapid rising and/or falling edges or glitches, and/or from electrical over stressing, such as electrostatic discharge (ESD) events. In one example, a fuse system can implement a shared power supply and fuse programming pad, rather than implementing separate pads to receive supply power and fuse programming signals. This shared pad can provide a number of advantages, such as reducing a pin count, reducing a cost of a semiconductor die, reducing a size of the semiconductor die, and/or enhancing a quality of power supply distribution. However, such shared power supply and fuse programming pad can subject the fuse system to power supply transients and/or electrical over stressing, resulting in accidental fuse programming (e.g., unintentionally blowing a fuse). In another example, a fuse system with separate power supply and fuse programming pads can be subjected to power supply transients and/or electrical over stressing.

This disclosure is directed to circuits, method, and devices for protecting against accidental fuse programming. For example, a fuse system can include a first fuse programming switch connected between a first pad and a fuse and a second fuse programming switch connected between the fuse and a second pad. The first pad can correspond to a power supply and/or fuse programming pad and the second pad can correspond to a ground pad or other voltage potential pad. When a control signal is received to program the fuse, the first and second fuse programming switches can be controlled to enable a current to flow through the fuse to blow the fuse or otherwise change the resistance of the fuse. At other times, the first and second fuse programming switches can be controlled or otherwise in a state to prevent a current from flowing through the fuse. The first fuse programming switch and/or the second fuse programming switch can isolate the fuse to protect against accidental fuse programming. In examples, the first fuse programming switch is a different type of device than the second fuse programming switch (e.g., one switch is a P-type device and the other an N-type device). This can also help to isolate the fuse from undesired voltage spikes. In examples, the second fuse programming switch can additionally be used to sense a value of the fuse.

The fuse system can also include other elements to protect against accidental fuse programming, such as a fuse protection capacitor, a fuse protection diode, and so on. The fuse protection capacitor can be electrically connected to the first pad and a gate of a cascode switch connected in series with the first switch. The fuse protection capacitor can adjust a bias voltage provided to the cascode switch in response to voltage spike, such as a positive voltage spike at the first pad. Further, the fuse protection diode can be electrically connected in series with the first switch between the first pad and the second pad. The fuse protection diode can protect against a voltage spike, such as a negative voltage spike at the first pad.

The fuse systems discussed herein can avoid accidental fuse programming due to power supply transients, electrical over stressing, or other undesired events. For example, the fuse systems can include one or more fuse protection elements, such as a fuse programming switch, a fuse protection capacitor, a fuse protection diode, etc. These elements can be arranged in a particular manner to prevent accidental fuse programming. Such fuse systems can increase chip yield by reducing a likelihood that a particular semiconductor die is defective due to inadvertent fuse programming during manufacturing and/or testing. Further, such fuse systems can reduce accidental fuse programming when a semiconductor die is being implemented in the field. Thus, the fuse systems discussed herein can improve fuse yield and/or reduce field returns, among other things.

Although a fuse system can include a fuse protection capacitor and/or a fuse protection diode to prevent many accidental fuse programming incidents, undesired voltage spikes can still make their way past such elements in some instances. As such, many examples discussed herein are directed to a fuse system that includes switches on different sides of a fuse to further isolate the fuse from undesired voltage spikes. This can further protect against accidental fuse programming. However, the fuse systems discussed herein can include any number of fuse protection elements.

FIG. 1 illustrates an example fuse system 100 (also referred to as a fuse circuit 100) that protects against accidental fuse programming. The fuse system 100 can include a switch 102, a switch 104, a fuse 106, a switch 108, a biasing circuit 110, a fuse sensing circuit 112, a biasing circuit 114, a first pad 116, and/or a second pad 118. The biasing circuit 110 and/or the biasing circuit 114 can control the switches 102, 104, and/or 108 to enable a current to pass through the fuse 106 to program the fuse 106. Moreover, the fuse sensing circuit 112 can provide a voltage or current to sense a state of the fuse 106 (e.g., a resistance of the fuse 106). The switch 102, the switch 104, and/or the switch 108 (as well as other elements) can protect against accidental fuse programming by isolating the fuse 106 from undesired voltage or current spikes, as discussed in further detail below.

As illustrated, the switch 102, the switch 104, the fuse 106, and the switch 108 are electrically connected in series between the first pad 116 and the second pad 118. In particular, the switch 102 is connected between the first pad 116 and the switch 104 and the switch 104 is connected between the switch 102 and the fuse 106. Further, a first end of the fuse 106 is connected to the switch 104 and a second end of the fuse 106 is connected to the switch 108. The switch 108 is connected between the fuse 106 and the second pad 118.

In the example of FIG. 1, the first pad 116 (sometimes referred to as a first point) corresponds to a shared power supply and fuse programming pad. For example, the first pad 116 connects to a power supply to receive power for both fuse programming and powering the components of the fuse system 100. That is, a pad used for fuse programming is shared with a power supply pad of a semiconductor die on which the fuse system 100 is implemented. Further, the second pad 118 (sometimes referred to as a second point) corresponds to a ground pad. Although discussed in the context of a shared power supply and programming pad, the first pad 116 and/or the second pad 118 can correspond to other types of pads. For example, the first pad 116 can be implemented as either a dedicated fuse programming pad or a dedicated power supply pad, in some instances. Further, the first pad 116 and/or the second pad 118 can be associated with other voltage potentials.

In examples, the switch 102 can be implemented as a fuse programming switch and the switch 104 can be implemented as a cascode switch. Including the cascode switch 104 can enhance the reliability of the fuse system 100 by preventing the fuse programming switch 102 from being exposed to overvoltage conditions that can lead to transistor damage and/or breakdown. For example, the fuse programming switch 102 and the cascode switch 104 can be rated to have a maximum gate-to-drain and/or gate-to-source voltage for a particular process. By including a series of switches, this can aid in achieving compliance with overstress and/or reliability specifications. In one example, the biasing circuit 110 controls a bias voltage applied to the cascode switch 104 based on a voltage different between the first pad 116 and the second pad 118 to, for example, a voltage level that is about halfway between a voltage of the first pad 116 and a voltage of the second pad 118. However, other cascode bias voltages are possible. Although one cascode switch 104 is illustrated in FIG. 1, any number of switches can be used in series with the fuse programming switch 102. Moreover, the cascode switch 104 can be removed in some examples.

The switch 108 can be implemented as a fuse programming and/or sensing switch. For example, the switch 108 can be controlled to facilitate programming of the fuse 106 with a value and/or sensing a value stored in the fuse 106, as discussed in further detail below.

The switch 102, the switch 104, and/or the switch 108 can be implemented as a wide variety of switches, such as voltage-controlled switches, current-controlled switches, etc. In the example of FIG. 1, the switch 102, the switch 104, and/or the switch 108 are each implemented as a transistor. A transistor can include a field-effect transistor (FET) (e.g., N-type or P-type device), such as a junction FET (JFET), insulated gate FET (e.g., a metal-oxide-semiconductor FET (MOSFET), a complementary metal-oxide-semiconductor (CMOS), etc.), and so on. Further, a transistor can include a Bipolar junction transistor (BJT) (e.g., an NPN transistor, a PNP transistor, etc.), such as a heterojunction bipolar transistors (HBT), etc. The switch 102, the switch 104, and/or the switch 108 can be implemented as the same type of switch or different types of switches, as discussed in various examples herein, including FIGS. 3 and 4.

As noted above, the biasing circuit 110 and/or the biasing circuit 114 can control the switch 102, the switch 104, and/or the switch 108 to program the fuse 106. For example, the biasing circuit 110 can receive a control signal 120 that instructs the biasing circuit 110 to program the fuse 106. The biasing circuit 110 can be electrically connected to the first pad 116 and the second pad 118 to receive power. In response to receiving the control signal 120, the biasing circuit 110 can generate a programming control voltage and apply the programming control voltage to control the switch 102 (e.g., provide the programming control voltage to a gate of the switch 102). Additionally, the biasing circuit 110 can generate a bias voltage and apply the bias voltage to control the switch 104 (e.g., provide the bias voltage to a gate of the switch 104). The programming control voltage and the bias voltage can be at a level (e.g., more or less than a threshold) to place the switches 102 and 104 in an "on state," enabling a current to flow through the switches 102 and 104.

Similarly, the biasing circuit 114 can receive a control signal 122 that instructs the biasing circuit 114 to program the fuse 106. The control signal 122 can be the same or different than the control signal 120. In general, the control signal 120 is received at the biasing circuit 110 around a same time (e.g., at a same time, within a window of time, etc.) as the control signal 122 is received at the biasing circuit 114. Although not shown in FIG. 1 for ease of illustration, the biasing circuit 114 can be electrically connected to the first pad 116 and the second pad 118 to receive power. In any event, in response to receiving the control signal 122 to program the fuse 106, the biasing circuit 114 can generate a programming control voltage and apply the programming control voltage to control the switch 108 (e.g., provide the programming control voltage to a gate of the switch 108). The programming control voltage can be at a level (e.g., more or less than a threshold) to place the switch 108 in an "on state," enabling a current to flow through the switch 108. Although the biasing circuit 110 and the biasing circuit 114 are illustrated as separate components, such circuits can be implemented as a single component or more than two components in some case.

When the switches 102,104, and 108 are each in an "on state," a current can flow through the fuse 106 to program the fuse 106. For example, a fuse programming current 124 can pass through the switch 102, the switch 104, the fuse 106, and the switch 108 to blow the fuse 106 or otherwise change the resistance of the fuse 106. The programming control voltage applied to the switch 102 and/or the programming control voltage applied to the switch 108 can generally control an amount of the fuse programming current 122. However, in some examples, the bias voltage applied to the switch 104 is also used. The fuse 106 can be programmed by providing a sufficient amount of current for a sufficient amount of time. For example, the fuse 106 can be blown by passing more than a threshold amount of current through the fuse 106 (e.g., a relatively large current) for more than a threshold amount of time. The amount of current and/or the amount of time can be configured based on properties of the fuse 106.

A fuse programming event can refer to a variety of events associated with programming a fuse. For example, a fuse programming event can include sending and/or receiving the control signal 120 and/or the control signal 122, etc. The control signal 120 and/or the control signal 122 can be sent from a variety of components, such as any component of a device, semiconductor die, etc. In examples, the control signal 120 and/or the control signal 122 are sent over a serial interface, such as a mobile industry processor interface (MIPI), radio frequency front end (RFFE) bus, an inter integrated circuit (I²C) bus, a serial peripheral interface (SPI) bus, etc. However, the control signal 120 and/or the control signal 122 can be sent in other manners.

Figure 6:
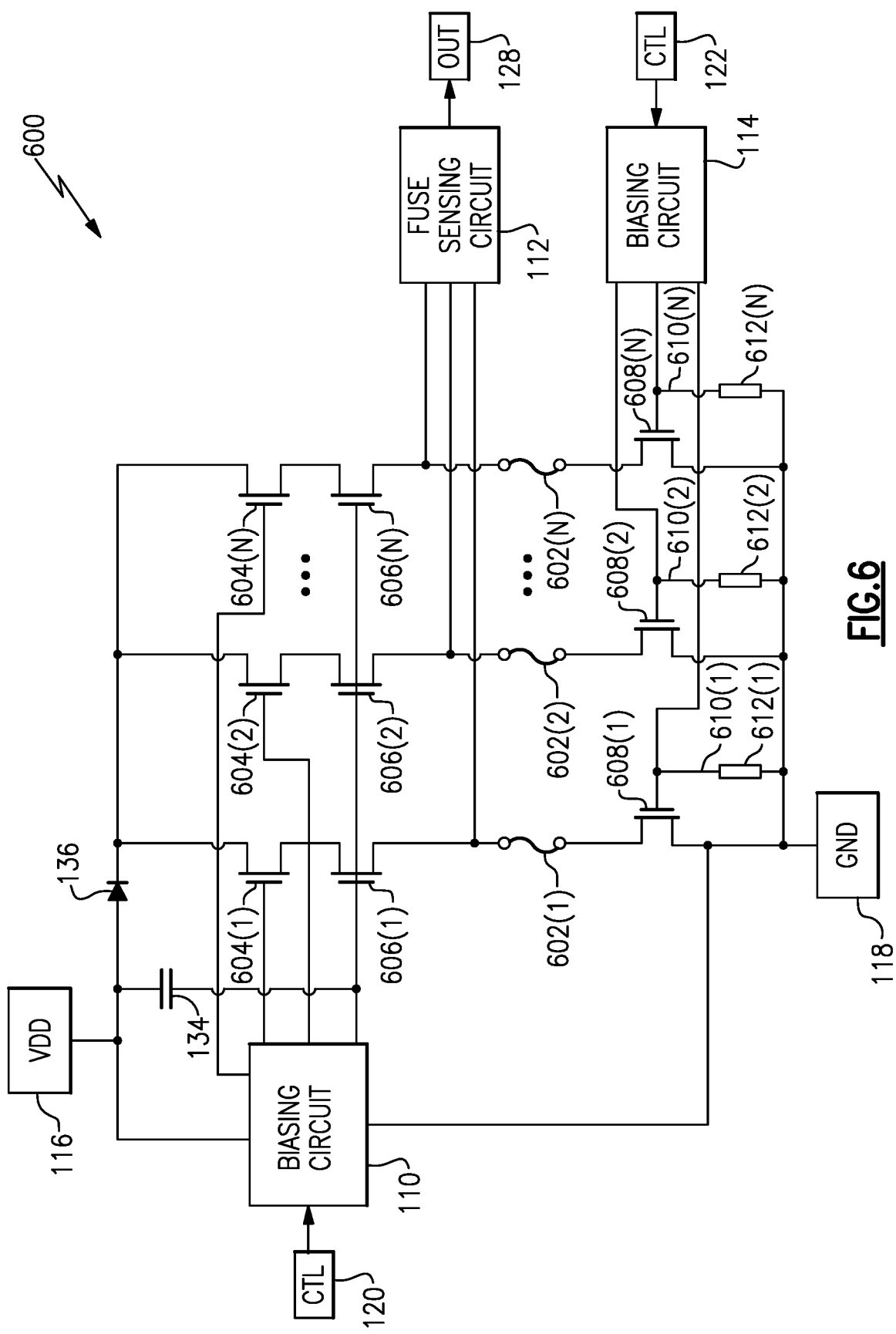
FIG. 6 illustrates an example fuse system with multiple fuses in accordance with one or more embodiments.
Figure 7:
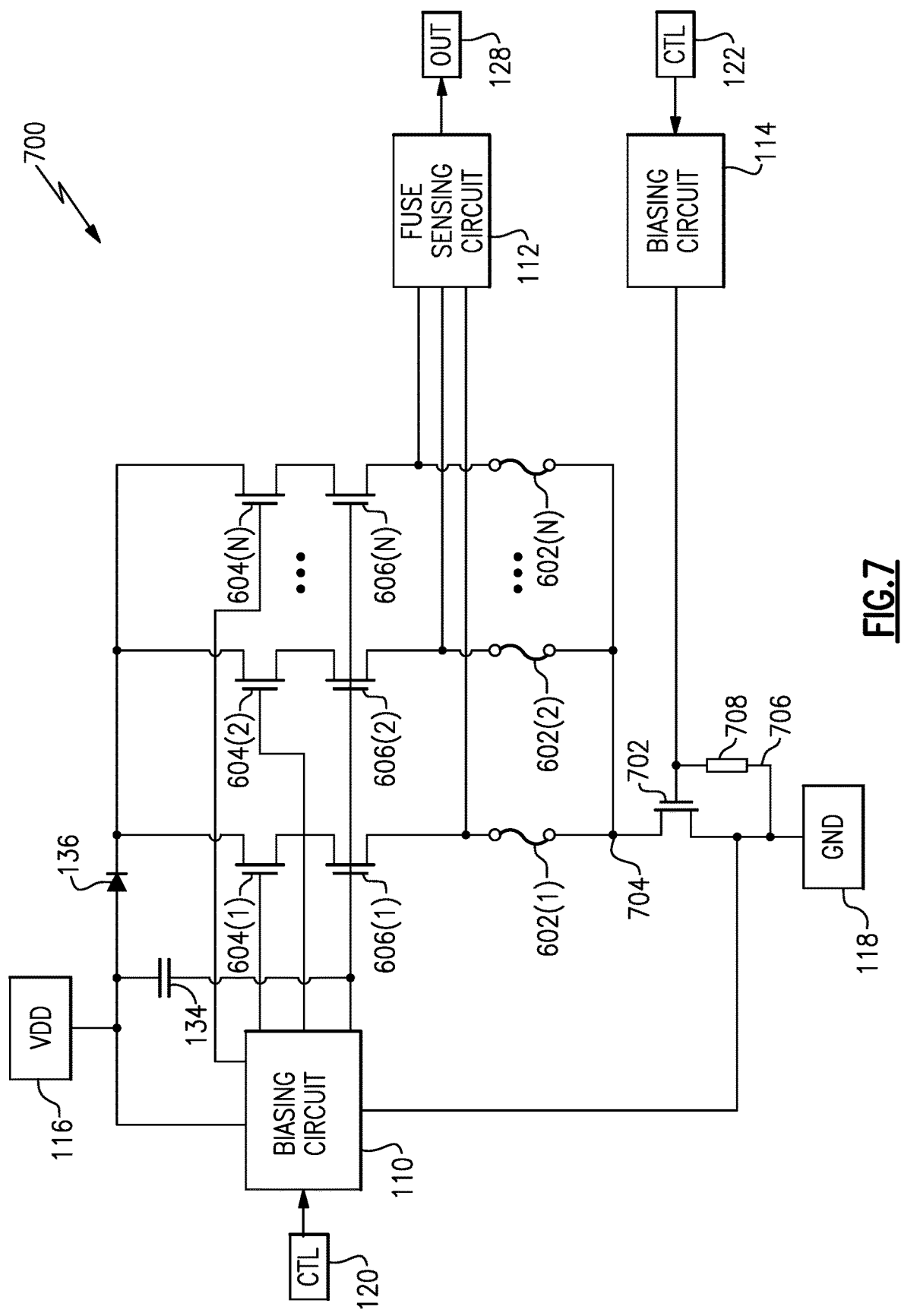
FIG. 7 illustrates another example fuse system with multiple fuses in accordance with one or more embodiments.
Figure 8:
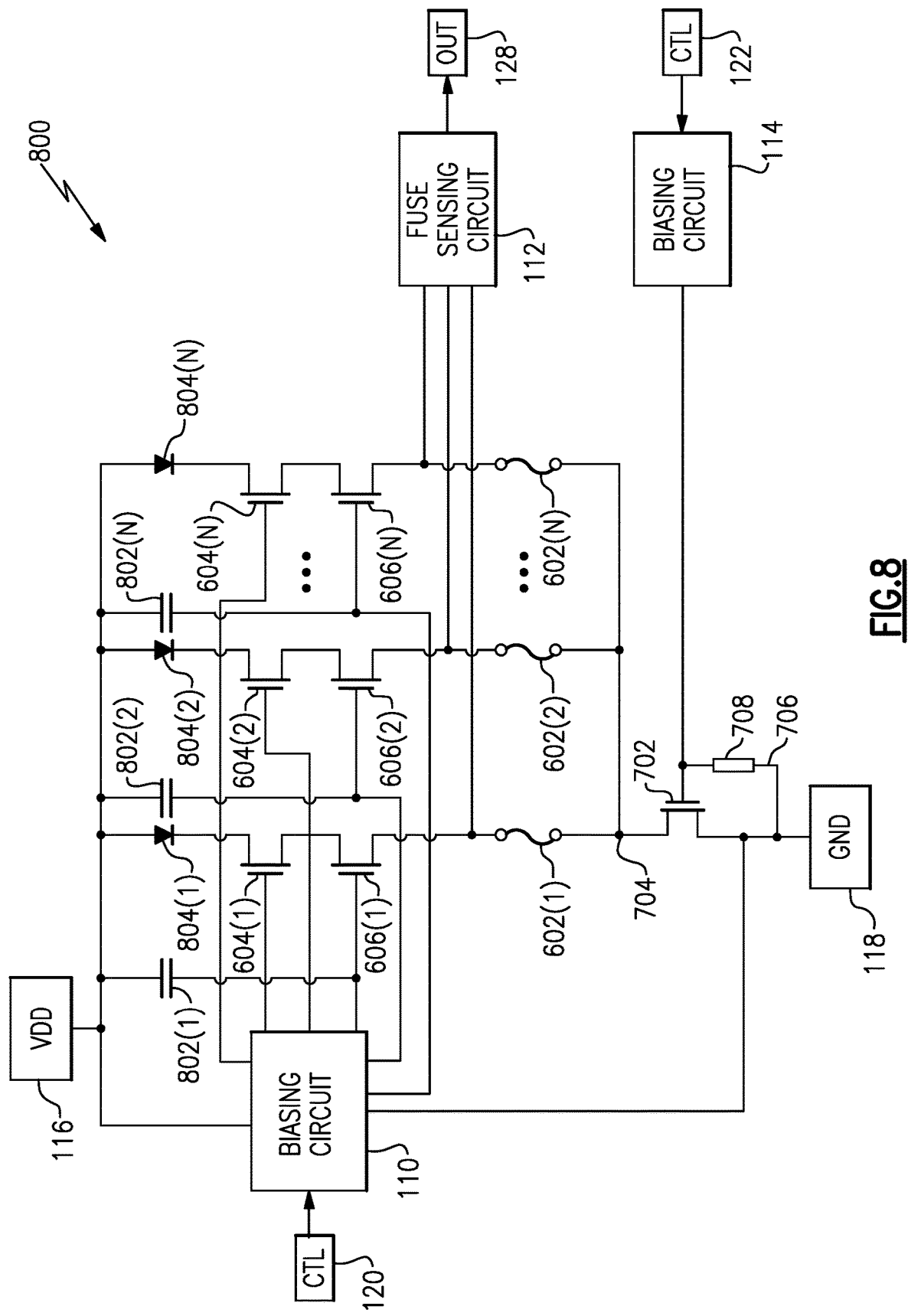
FIG. 8 illustrates another example fuse system with multiple fuses in accordance with one or more embodiments.

The fuse 106 can be implemented in a variety of ways. In one example, the fuse 106 is implemented as a polysilicon fuse that has a low resistance prior to programming (when the fuse 106 in unblown) and a higher resistance after programming (when the fuse 106 is blown). To illustrate, an intact fuse can have a resistance of approximately 200 Ohms, while a blown fuse can have a resistance of approximately 2000 Ohms (e.g., a magnitude higher). In some examples, the fuse 106 is programmed to a permanent state (e.g., an irreversible state), while in other examples the fuse 106 is programmed to a non-permanent state (e.g., a reversible state). The fuse 106 is sometimes referred to as a fuse cell. Although illustrated with a single fuse 106 in FIG. 1, the fuse system 100 can include any number of fuses. Example fuse systems with multiple fuses are shown in FIGS. 6-8.

The fuse sensing circuit 112 can be used to sense a state of the fuse 106. As shown, an input of the fuse sensing circuit 112 is connected to a first terminal of the fuse 106. The fuse sensing circuit 112 can receive a control signal to sense a state of the fuse 106 and, in response, provide a voltage or current to detect a resistance of the fuse 106. In examples, the fuse sensing circuit 112 operates in cooperation with the biasing circuit 114. Here, when sensing the fuse 106, the biasing circuit 114 can provide a voltage to the switch 108 (e.g., apply a bias voltage to a gate of the switch 108) to place the switch 108 in an "on state." A fuse sensing current 126 can then flow through the fuse 106 in instances where the fuse 106 is not blown. The fuse sensing circuit 112 can detect a resistance of the fuse 106 based on the presence or lack of the fuse sensing current 126 and/or an amount of the fuse sensing current 126. The fuse sensing circuit 112 can then provide an output signal 128 indicating a state of the fuse 106 (e.g., if the fuse 106 is blown or unblown). As such, data stored in the fuse 106 can be read. In examples, when sensing the fuse 106, the switches 102 and/or 104 are in an "off state" to prevent a current from flow through the switches 102 and 104 down towards the fuse 106.

A fuse sensing event can refer to a variety of events associated with sensing a fuse. For example, a fuse sensing event can include sending and/or receiving a control signal instructing the fuse sensing circuit 112 and/or the biasing circuit 114 to sense the fuse 106, etc. In examples, a signal to sense a fuse is sent over a serial interface, such as any of the serial interfaces discussed above.

As illustrated in FIG. 1, the switch 108 can be connected to a conductive path 130. The conductive path 130 can create a route to bleed current from a gate of the switch 108 when the fuse 106 is not being programmed or sensed. For example, when the biasing circuit 114 has not received a fuse programming control signal or fuse sensing signal, the biasing circuit 114 can refrain from providing a voltage to the switch 108, causing the switch 108 to be placed in an "off state." Here, the conductive path 130 can bleed any current or voltage that remains or collects on a gate of the switch 108. This can assist in maintaining the switch 108 in an "off state." In some examples, the conductive path 130 can include a resistor 132. In one example, the resistor 132 is implemented as a 1 mega Ohm resistor. However, any type of resistor can be used.

Although a single switch 108 is illustrated in FIG. 1 below the fuse 106, in other examples multiple switches are used (e.g., multiple switches in series in place of the single switch 108).

In the example of FIG. 1, the fuse system 100 also includes other fuse protection elements. For example, the fuse system can include a capacitor 134 (also referred to as a fuse protection capacitor) electrically connected to a gate of the switch 104 and the first pad 116. The capacitor 134 is used to provide coupling to the gate of the switch 104. The capacitor 134 can have a variety of capacitance values. In one example, the capacitor 134 has a capacitance of at least 1 pF. The capacitor 134 corresponds to an explicit capacitor, rather than a mere parasitic capacitance. Although the capacitor 134 is illustrated at a particular location, the capacitor 134 can be positioned at other locations.

As can be understood, the impedance of the capacitor 134 can be frequency dependent. In particular, the capacitor 134 can pass high frequency signal components while block low frequency signal components. For instance, the capacitor 134 can behave as a short circuit in response to a voltage signal having a frequency above a high frequency threshold and as an open circuit in response to a voltage signal having a frequency below a low frequency threshold. The high and low frequency thresholds can be dependent, in part, on a capacitance value of the capacitor 134. In some examples, a capacitance value of the capacitor 134 is selected such that the capacitor 134 behaves as a short circuit in response to high-frequency events, such as ESD events and/or sharp power supply edges, and otherwise behaves as an open circuit.

Figure 2:
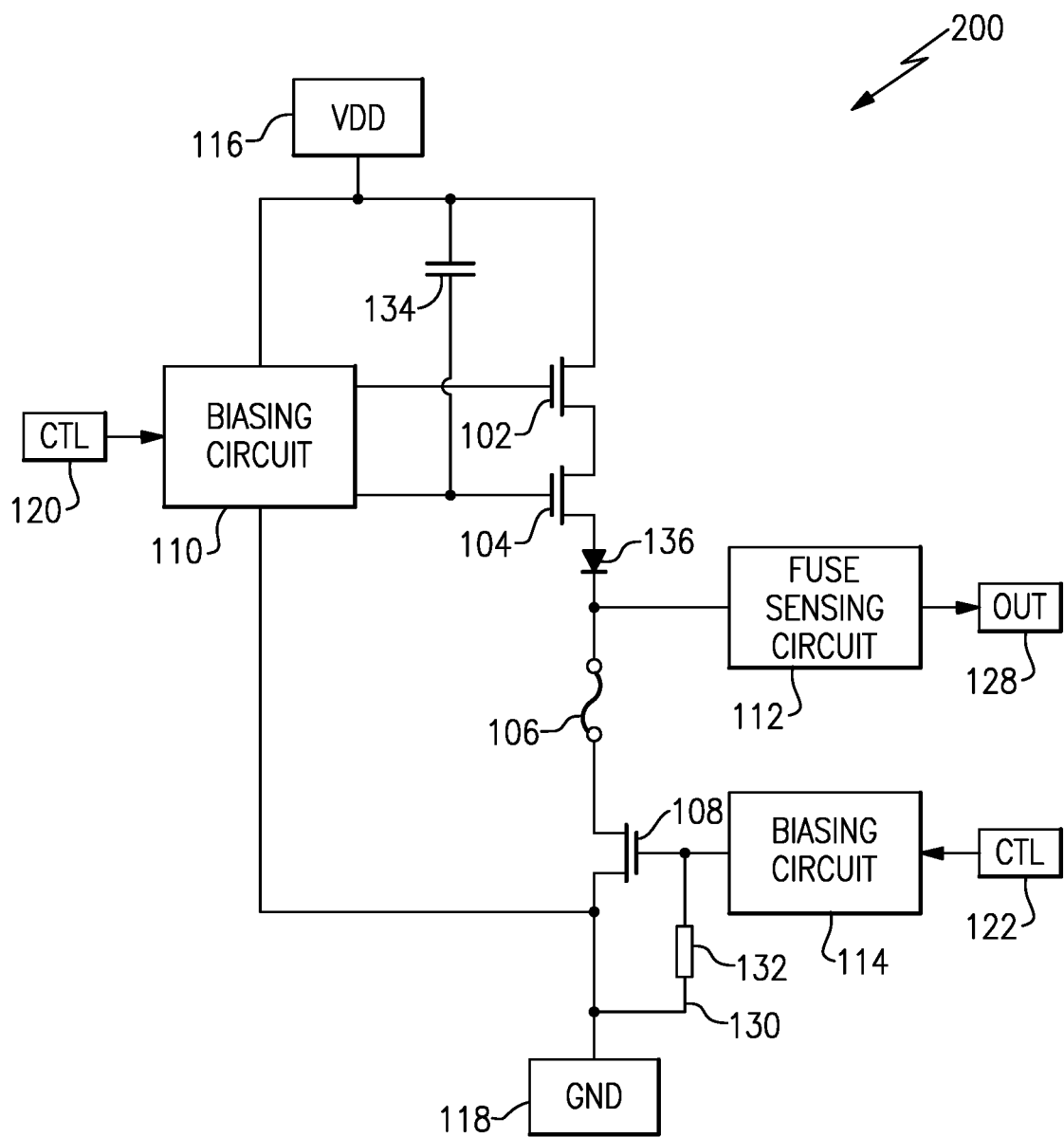
FIG. 2 illustrates an example fuse system with a diode positioned below a fuse programming switch in accordance with one or more embodiments.

Further, the fuse system 100 can include a diode 136 (also referred to as a fuse protection diode) electrically connected in series with the switch 102 and/or the switch 104 between the first pad 116 and the fuse 106. In this example, the diode 136 is placed between the first pad 116 and the switch 102. Here, an anode of the diode 136 is connected to the first pad 116 and a cathode of the diode 136 is connected to the switch 102 (e.g., a source of the switch 102). Another example illustrating placement of the diode 136 is shown in FIG. 2. However, FIGS. 1 and 2 merely illustrate a few of the many locations where the diode 136 can be placed. In other examples, the diode 136 can be placed elsewhere, such as between the switches 102 and 104, below the fuse 106, below the switch 108, and/or another location.

As noted above, a fuse system, such as the fuse system 100, can be subjected to undesired voltage or current spikes (both positive and negative). For example, during manufacturing, testing (e.g., qualification), and/or end-use, the fuse system 100 can be subjected to power supply transients (e.g., sharp positive/negative edges) and/or electrical over stressing (e.g., ESD events). In some examples, these power supply transients and/or electrical over stressing occur when a device that includes the fuse system 100 is turned on and/or experiencing relatively high activity (e.g., high processing).

Such voltage or current spikes can cause undesired events to occur. For example, the biasing circuit 110 can bias the switch 102 and/or the switch 104 to an improper bias level during these voltage spikes. This can cause the switch 102 and/or the switch 104 to be in an "on state" when the switch 102 and/or the switch 104 should be in an "off state." Similarly, during undesirable voltage spikes, the biasing circuit 114 can bias the switch 108 to an improper bias level. The improper biasing of the switches 102, 104, and/or 108 can arise from a delay of the biasing circuit 110 and/or biasing circuit 114 in generating voltages to apply to the switches 102, 104, and/or 108. Absent a protection scheme, such improper biasing can allow a current to flow through the fuse 106 and inadvertently program the fuse 106.

To illustrate, assume that the fuse system 100 is implemented without the switch 108, the capacitor 134, and the diode 136. Also, assume that the switches 102 and 104 are implemented as P-type transistors and are initially biased with relatively low voltages, but the switches 102 and 104 are in an "off state." In this illustration, an undesired sharp positive voltage spike occurring at the first pad 116 can cause a voltage at a source of the switch 102 and/or the switch 104 to raise to an unintended level. Here, a delay of the biasing circuit 110 in generating the appropriate biasing voltage can cause voltages applied to the switch 102 and/or the switch 104 to remain at the initial relatively low voltage level. This can cause the switch 102 and/or the switch 104 to enable current flow, ultimately causing a current to flow through the fuse 106 and accidentally programming the fuse 106.

To protect against accidental fuse programming, the fuse system 100 can include one or more of the various fuse protection elements discussed herein. For example, the fuse system 100 can include the switch 102, the switch 104, and/or the switch 108 to control when current flows through the fuse 106 for programming. In examples, one or more of the upper switches 102 and 104 can be a first type of device (e.g., P-Type or N-Type), while the lower switch 108 can be a second type of device (e.g., N-Type or P-type). This can allow the lower switch 118 to remain in an "off state" while one or more of the upper switches 102 and 104 are changed to an "on state" due to an undesired voltage spike, or vice versa. Further, in examples, the switch 102, the switch 104, and/or the switch 108 can be associated with different gate threshold voltage levels, so that different amounts of voltages place the switch 102, the switch 104, and/or the switch 108 in an "on state."

Additionally, or alternatively, the fuse system 100 can include the capacitor 134. The capacitor 134 can help compensate for a delay of the biasing circuit 110 in controlling a voltage applied to the switch 104. For example, the capacitor 134 can provide coupling from the first pad 116 to a gate of the switch 104, allowing the capacitor 134 to adjust a bias voltage of the switch 104 in response to a change in a voltage of the first pad 116 relative to a voltage of the second pad 118. To illustrate, the capacitor 134 can serve to increase a gate voltage of the switch 104 in response to a rising edge of a voltage at the first pad 116 (e.g., a sharp positive supply voltage spike), thereby maintaining the switch 104 in an "off state." This serves to delay or cut off a current path through the fuse 106.

Additionally, or alternatively, the fuse system 100 can include the diode 136. The diode 136 can help prevent inadvertent programming of the fuse 106 by blocking current from flowing through the fuse 106 in response to a decrease in voltage of the first pad 116 relative to the second pad 118. For example, the diode 136 can serve to cut off a negative edge of a voltage at the first pad 116 (e.g., a sharp negative supply voltage spike).

Although FIG. 1 illustrates various fuse protection elements, the fuse system 100 can be implemented with any number of switches, capacitors, diodes, and/or other fuse protection elements. For example, the fuse system 100 can be implemented without one or more of the switch 102, the switch 104, the switch 108, the capacitor 134, and the diode 136.

FIG. 2 illustrates an example fuse system 200 with a diode positioned below a fuse programming switch. The fuse system 200 is similar to the fuse system 100 of FIG. 1, except that the diode 136 is positioned below the switches 102 and 104. In examples, this arrangement of the diode 136 can provide similar advantages as those discussed above with respect to FIG. 1. For example, the diode 136 positioned within the fuse system 200 can help prevent inadvertent programming of the fuse 106 by blocking current from flowing through the fuse 106 in response to a decrease in voltage of the first pad 116 relative to the second pad 118.

Figure 3:
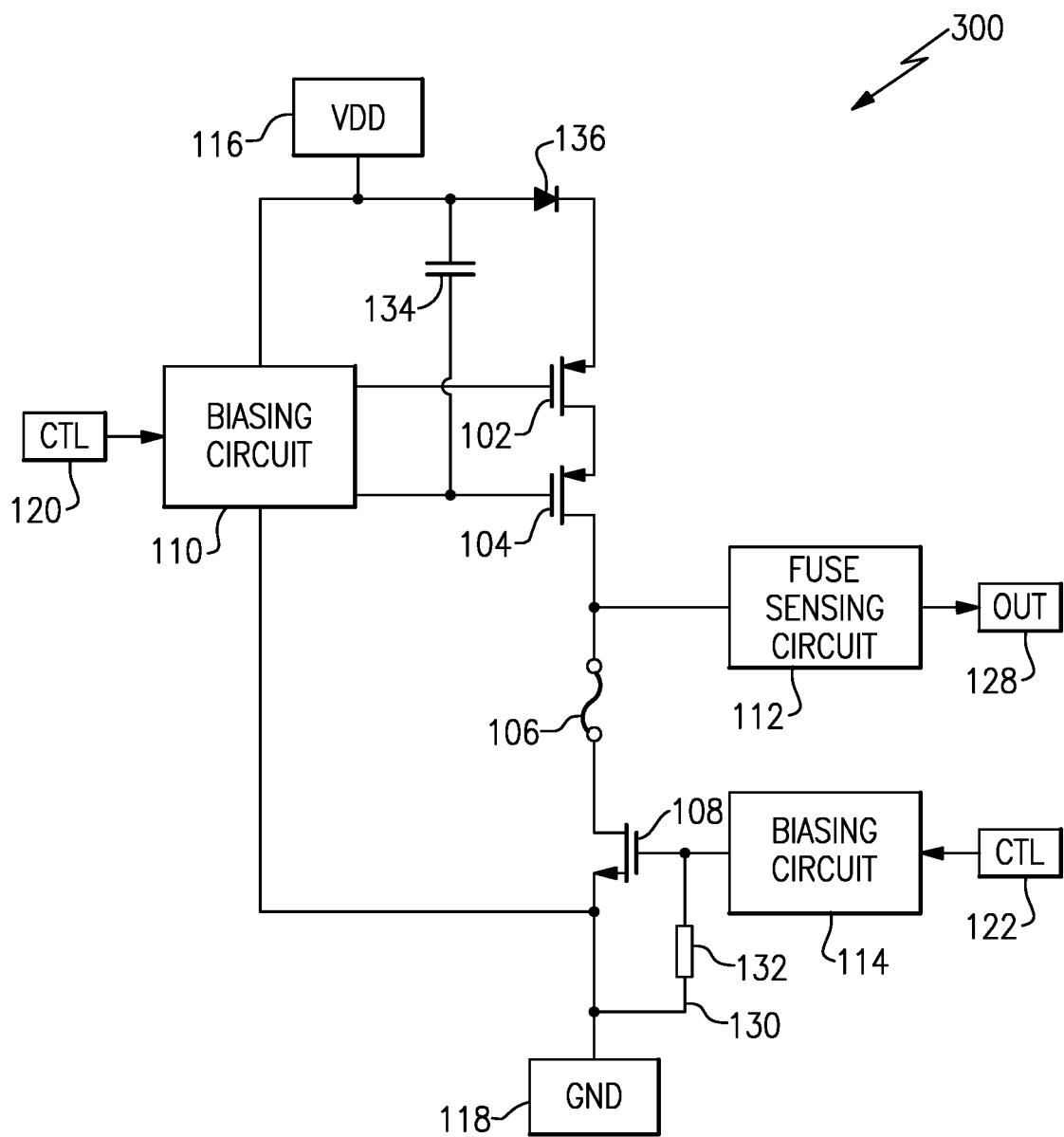
FIG. 3 illustrates an example fuse system with P-type upper transistors and an N-type lower transistor in accordance with one or more embodiments.

FIG. 3 illustrates an example fuse system 300 with P-type upper transistors and an N-type lower transistor. In particular, the fuse system 300 illustrates an example implementation of the fuse system 100 of FIG. 1 with the switches 102 and 104 above the fuse 106 implemented as P-type transistors (e.g., PFETs) and the switch 108 below the fuse 106 implemented as an N-type transistor (e.g., NFET). Although undesired voltage spikes are often handled by the capacitor 136 and/or the diode 136, such voltage spikes can still cause accidental fuse programming in some instances (e.g., an undesired current can still flow through the fuse 106 from time to time, even with the capacitor 136 and the diode 136). By including different types of switches, the fuse system 300 can isolate the fuse 106 even further from undesired voltage spikes.

In one illustration, assume that a power supply is not yet connected to the fuse system 300, and thus, no bias voltages are applied to the switches 102, 104, and 108. Also, assume that an undesired voltage spike occurs that is not handled by the capacitor 134 and/or the diode 136 (e.g., the voltage spike makes its way past the switches 102 and 104). Since no bias voltage is applied to the switch 108, the switch 108 can remain in an "off state" and prevent a current from flowing through the fuse 106. As such, the fuse system 300 can protect against accidental fuse programming.

In another illustration, assume that a power supply is connected and the fuse system 300 is powered on to a steady state. In particular, the appropriate bias voltages are applied to the switches 102, 104, and 108 to maintain each of the switches 102, 104, and 108 in a non-programming state (e.g., an "off state"). Even if an undesired voltage spike occurs that is not handled by the capacitor 134 and/or the diode 136, the switch 108, for example, can remain in an "off state" and prevent a current from flowing through the fuse 106.

Figure 4:
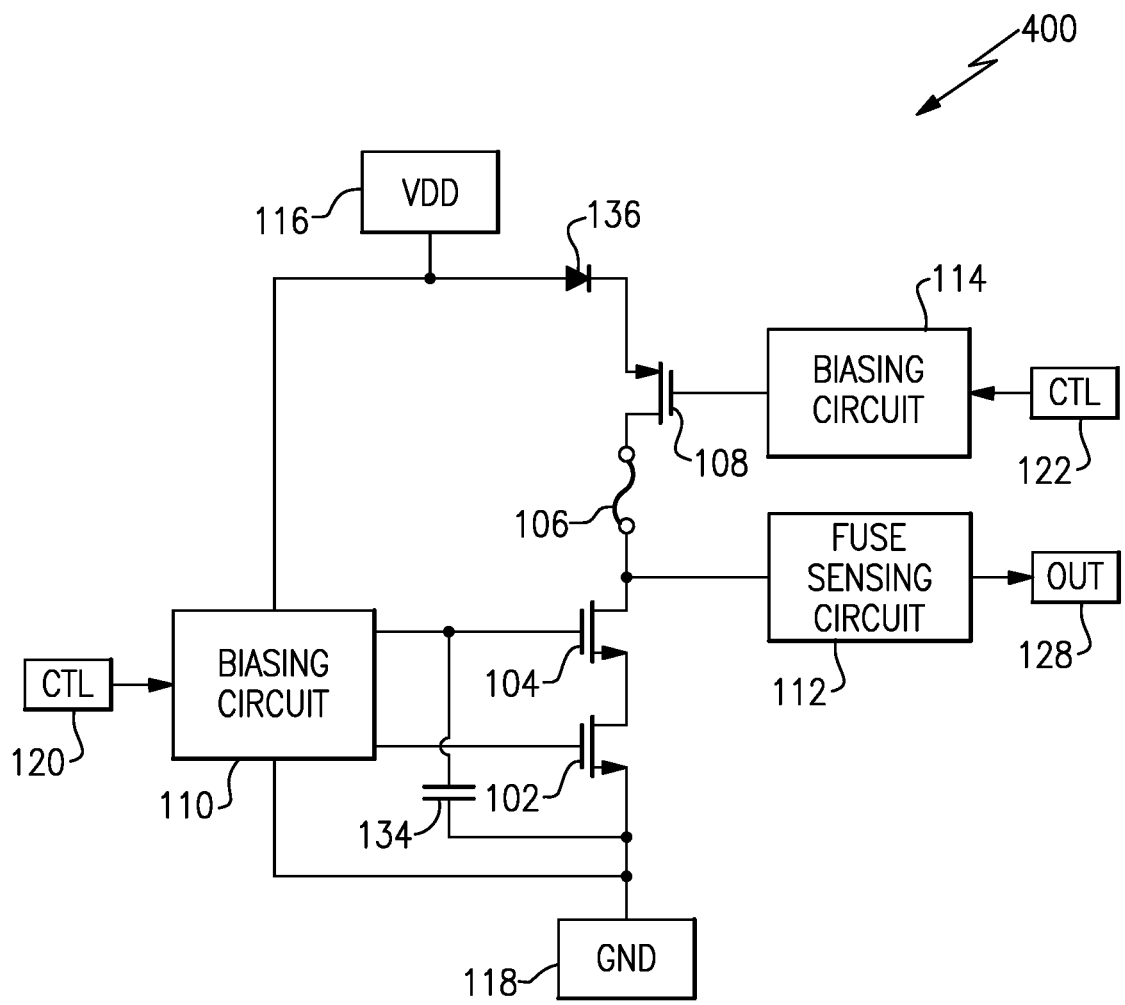
FIG. 4 illustrates an example fuse system with a P-type upper transistor and N-type lower transistors in accordance with one or more embodiments.

FIG. 4 illustrates an example fuse system 400 with a P-type upper transistor and N-type lower transistors. In particular, the fuse system 400 illustrates a complementary implementation of the fuse system 100 of FIG. 1, using different types of transistors.

As shown, the fuse system 400 includes the switch 108 electrically connected between the first pad 116 (specifically, the diode 136) and the fuse 106. The switch 104 is electrically connected between the fuse 106 and the switch 102. Further, the switch 102 is electrically connected between the switch 104 and the second pad 118. As such, the switch 108, the fuse 106, the switch 104, and the switch 102 are electrically connected in series.

The biasing circuit 110 and/or the biasing circuit 114 can apply voltages to the switches 102, 104, and/or 108 to program and/or sense the fuse 106, as similarly discussed above. For example, in response to receiving the control signal 122 to program the fuse 106, the biasing circuit 114 can generate a programming control voltage and apply the programming control voltage to control the switch 108 (e.g., provide an appropriate level of voltage to a gate of the switch 108 to place the switch 108 in an "on state"). Further, in response to receiving the control signal 120 to program the fuse 106, the biasing circuit 110 can generate a programming control voltage and apply the programming control voltage to control the switch 102 (e.g., provide an appropriate level of voltage to a gate of the switch 102 to place the switch 102 in an "on state"). Additionally, the biasing circuit 110 can generate a bias voltage and apply the bias voltage to control the switch 104 (e.g., (e.g., provide an appropriate level of voltage to a gate of the switch 104 to place the switch 104 in an "on state"). Moreover, in response to receiving a control signal to sense a state of the fuse 106, the fuse sensing circuit 112 can apply a voltage and/or the biasing circuit 114 can apply a voltage to the switch 108 (e.g., provide an appropriate level of voltage to a gate of the switch 108 to place the switch 108 in an "on state") to detect a resistance of the fuse 106.

Although not illustrated in FIG. 4, in some instances a gate of the switch 102 is connected to the second pad 118. For example, the gate of the switch 102 can be connected to the second pad 118 through a conductive path to bleed current from a gate of the switch 102 when the fuse 106 is not being programmed or sensed. The conductive path can include a resistor, similar to the conductive path 130.

Figure 5:
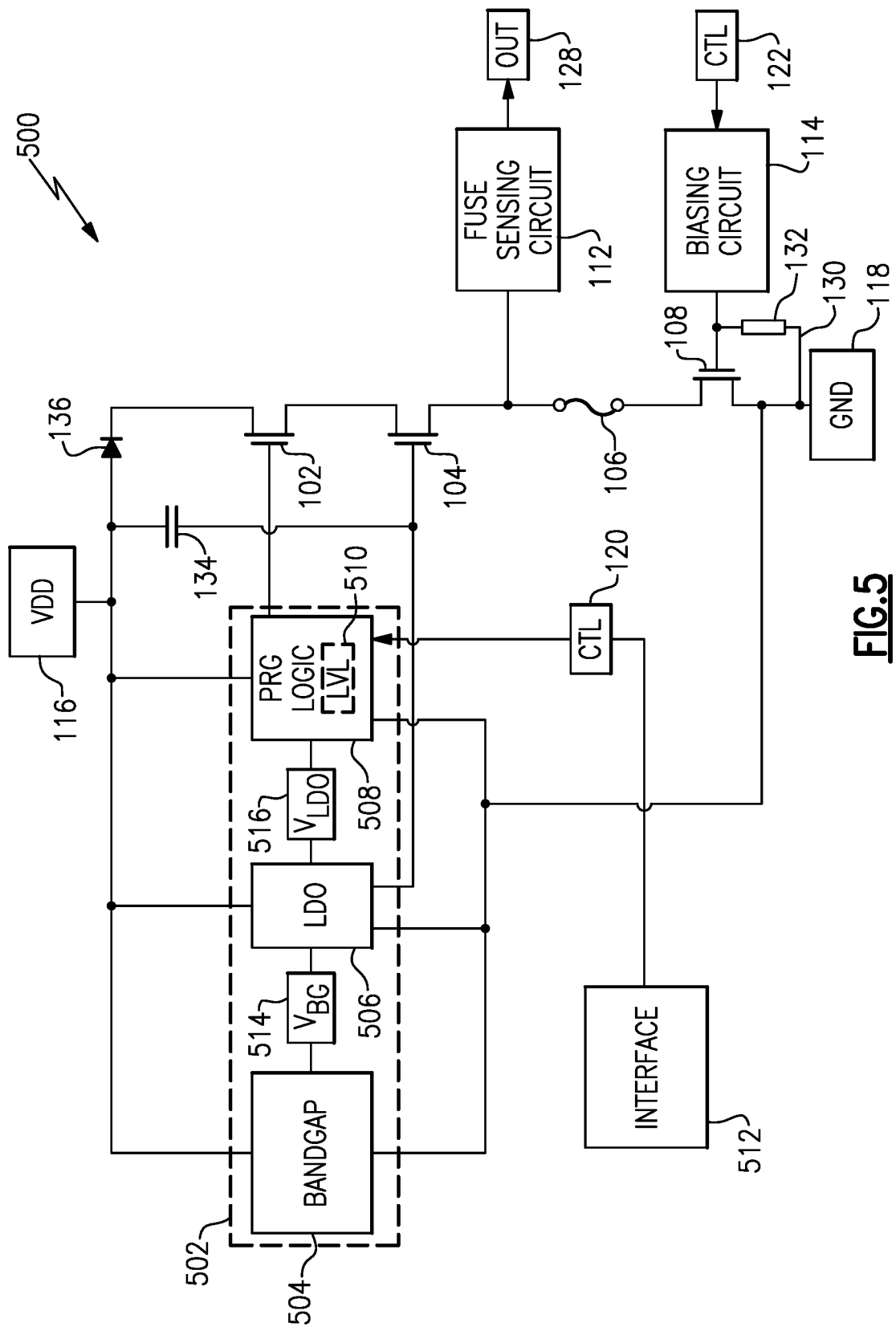
FIG. 5 illustrates an example fuse system with various example details of a biasing circuit in accordance with one or more embodiments.

FIG. 5 illustrates an example fuse system 500 with various example details of a biasing circuit. For example, the fuse system 500 includes a biasing circuit 502 that can be similar to the biasing circuit 110 of FIG. 1 (and/or the biasing circuit 114, in some cases). Other elements of the fuse system 500 can be similar to the fuse system 100 as well, as illustrated.

The biasing circuit 502 can include a bandgap reference circuit 504, a low dropout (LDO) regulator 506, and a programming logic circuit 508 that includes a level-shifter 510. In examples, the biasing circuit 502 receives the control signal 120 over a serial interface 512, which can be, for example, a mobile industry processor interface (MIPI) radio frequency front end (RFFE) bus, an inter integrated circuit ($I^2C$) bus, and/or a serial peripheral interface (SPI) bus.

The bandgap reference circuit 504 can be electrically connected between the first pad 116 and the second pad 118 to receive power. The bandgap reference circuit 504 can generate a bandgap reference voltage 514 ($V_{BG}$), which is substantially independent of temperature. The bandgap reference voltage 514 can serve as a reference voltage to the LDO regulator 506, which generates one or more regulated voltages based on a supply voltage received on the first pad 116 and the bandgap reference voltage 514. In the illustrated example, the LDO regulator 506 generates a bias voltage for the switch 104 and an LDO voltage 516 ($V_{LDO}$) for the level shifter 510 of the programming logic circuit 508.

In examples, the level shifter 510 level shifts the control signal 120 received from the serial interface 512 to generate a fuse programming voltage. The fuse programming voltage can be applied to the switch 102. In some instances, an output of the level shifter 510 is controllable between a high voltage about equal to a power supply voltage received on the first pad 116 and a low voltage about equal to the LDO voltage 516. The LDO voltage 516 can be selected based on a variety of factors, for instance, to control an amount of current during programming and/or based on a maximum gate-to-source voltage of the switch 102 permitted for a particular process.

In examples, during an undesired voltage spike, the biasing circuit 502 can bias the switch 102 and/or the switch 104 to an improper voltage level. This can arise from a delay of the biasing circuit 502 in generating bias voltages, such as a delay of the LDO regulator 506 in providing voltage regulation. Thus, the fuse system 500 implements various fuse protection elements (e.g., the switch 102, the switch, 104, the switch 108, the capacitor 134, and/or the diode 136) to prevent accidental fuse programming due to improper biasing.

In examples, the biasing circuit 114 can include similar components as those shown for the biasing circuit 502.

FIG. 6 illustrates an example fuse system 600 with multiple fuses. In particular, the fuse system 600 includes a plurality of fuses 602(1)-602(N), where N represents a number greater than 1. This example shows three fuses 602, however, any number of fuses can be used. The fuses 602 can be used to store data for a variety of purposes. In examples, each of the fuses 602 corresponds to a bit of a data element.

As illustrated, the fuse system 600 includes a plurality of fuse programming switches 604(1)-604(N), a plurality of cascode switches 606(1)-606(N), and a plurality of fuse programming switches 608(1)-608(N). Although referred to as fuse programming switches, the fuse programming switches 608 can be used for fuse programming and/or sensing. Each of the fuse programming switches 604 can be similar to the switch 102, each of the cascode switches 606 can be similar to the switch 104, and each of the fuse programming switches 608 can be similar to the switch 108. Each vertical conductive path associated with one of the fuses 602 can include multiple switches connected in series. For example, the fuse 602(1) is electrically connected in series with the programming switch 604(1), the cascode switch 606(1), and the fuse programming switch 608(1).

The biasing circuit 110 can control the fuse programming switches 604 and/or the cascode switches 606 to program the fuses 602. The biasing circuit 114 can also operate to control the fuse programming fuse 608 to program the fuses 602. For example, in response to receiving the control signal 120 to program the fuse 602(1), the biasing circuit 110 can bias the fuse programming switch 604(1) and/or the cascode switch 606(1) to enable a current to flow through the fuse programming switch 604(1) and/or the cascode switch 606(1). In the example of FIG. 6, the biasing circuit 110 biases the cascode switches 606 with a same voltage. Meanwhile, in response to receiving the control signal 122 to program the fuse 602(1), the biasing circuit 114 can bias the fuse programming switch 608(1) to enable a current to flow through the fuse programming switch 608(1). When the fuse programming switch 604(1), the cascode switch 606(1), and the fuse programming switch 608(1) are each in an "on state," a current can flow through the fuse 602(1) to program the fuse 602(1).

The fuse sensing circuit 112 and/or the biasing circuit 114 can also operate to sense any of the fuses 602. For example, in response to receiving a control signal to sense the fuse 602(1), the biasing circuit 114 can bias the fuse programming switch 608(1) to an "open state" and the fuse sensing circuit 112 can detect a value of the fuse 602(1).

The fuse system 600 can also include a plurality of conductive paths 610(1)-610(N) to bleed current from gates of the fuse programming switches 608, respectively, when the fuses 602 are not being programmed or sensed. The conductive paths 610 can include a plurality of resistors 612(1)-612(N), respectively.

FIG. 7 illustrates another example fuse system 700 with multiple fuses. The fuse system 700 can be similar to the fuse system 600 of FIG. 6, except that the fuse system 700 includes a single fuse programming switch 702 below the fuses 602. Here, the fuses 602 are electrically connected to a node 704, and the fuse programming switch 702 is connected to the node 704 between the node 704 and the second pad 118. Thus, the fuse programming switch 702 is electrically connected in parallel with the fuses 602. As illustrated, the fuse system 700 can include a conductive path 706 that can include a resistor 708.

In this example, the biasing circuit 114 can control the fuse programming switch 702 to enable a current to flow through any one of the fuses 602 when the control signal 122 indicates that any one of the fuses 602 is to be programmed. For example, the biasing circuit 114 can bias the fuse programming switch 702 to be in an "on state" when the fuse 602(1) is to be programmed. The biasing circuit 114 can also bias the fuse programming switch 702 to be in an "on state" when the fuse 602(2) is to be programmed (e.g., at a different time).

FIG. 8 illustrates another example fuse system 800 with multiple fuses. The fuse system 800 can be similar to the fuse system 700 of FIG. 7, except that the fuse system 800 includes a plurality of capacitors 802(1)-802(N) and a plurality of diodes 804(1)-804(N). In addition, the biasing circuit 110 connects to the cascode switches 606 through separate conductive paths. The capacitors 802 are connected to the conductive paths, respectively. For example, the capacitor 802(1) is electrically connected to the conductive path that connects the biasing circuit 110 to a gate of the cascode switch 606(1). As such, the capacitor 802(1) is electrically connected between the first pad 116 and the gate of the cascode switch 606(1). Further, the diodes 804 are connected to the fuse programming switches 604. For example, the diode 804(1) is connected to a source/drain of the fuse programming switch 604(1).

Figure 9:
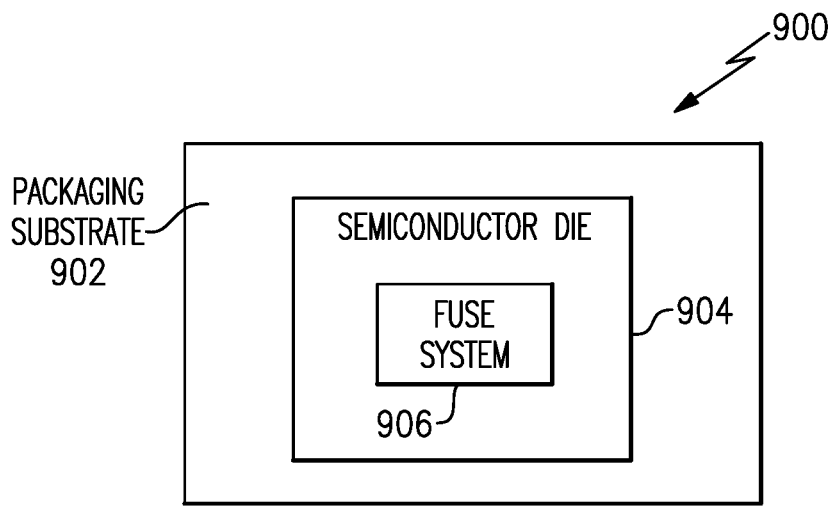
FIG. 9 illustrates an example packaged module in accordance with one or more embodiments.

FIG. 9 illustrates an example packaged module 900. The packaged module 900 includes a packaging substrate 902, a semiconductor die 904 implemented on the packaging substrate 902, and a fuse system 906 implemented on the semiconductor die 904. The fuse system 906 can include any of the fuse systems discussed herein. In examples, the semiconductor die 904 can include a semiconductor substrate.

Figure 10:
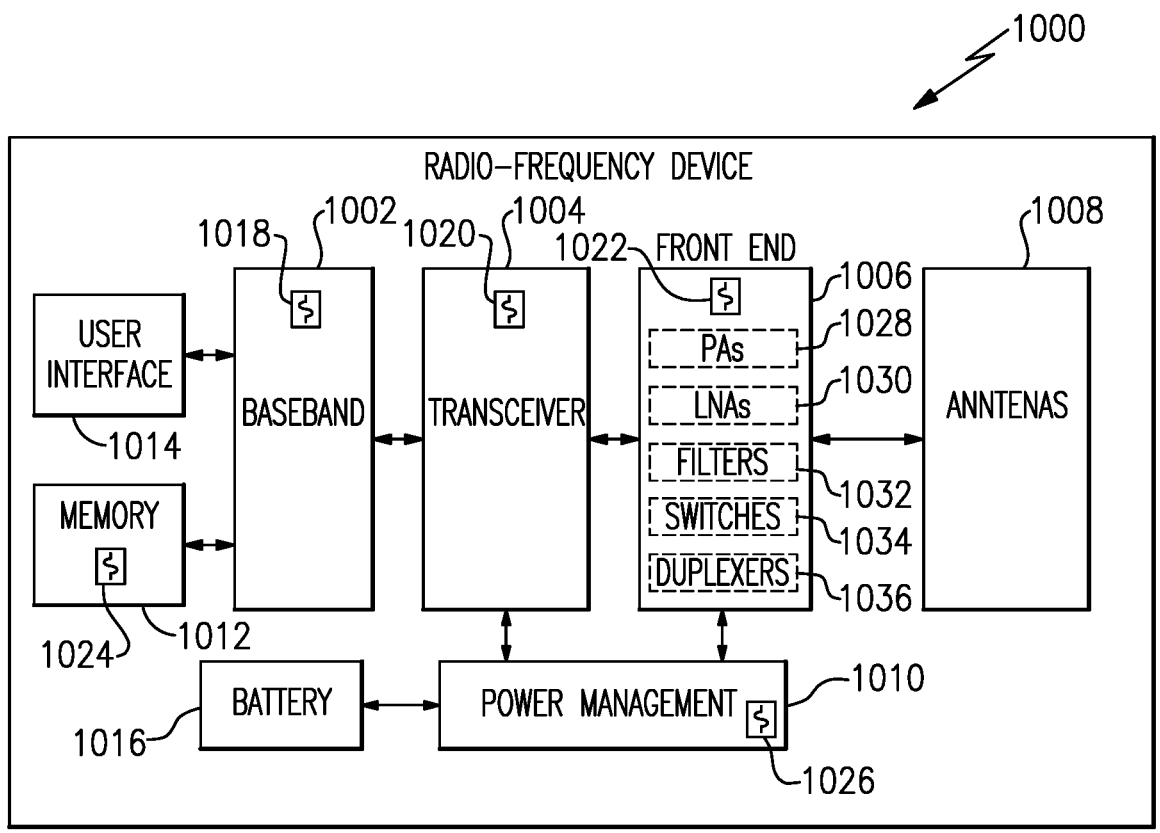
FIG. 10 illustrates an example radio-frequency device in accordance with one or more embodiments.

FIG. 10 illustrates an example radio-frequency device 1000. The radio-frequency device 1000 includes a baseband system 1002, a transceiver 1004, a front end system 1006, antennas 1008, a power management system 1010, a memory 1012, a user interface 1014, and a battery 1016. The baseband system 1002, the transceiver 1004, the front end system 1006, the antennas 1008, the power management system 1010, the memory 1012, the user interface 1014, and/or the battery 1016 can be in communication with each other.

The radio-frequency device 1000 can include one or more fuse systems implemented in accordance with the features discussed herein. For example, in the illustrated embodiment, the baseband system 1002 includes a fuse system 1018, the transceiver 1004 includes a fuse system 1020, the front end system 1006 includes a fuse system 1022, the memory 1012 includes a fuse system 1024, and the power management system 1010 includes a fuse system 1026. One or more of the fuse systems 1018-1026 can be implemented in accordance with the examples discussed herein.

The radio-frequency device 1000 can communicate using a wide variety of communications technologies, including, but not limited to, 2G, 3G, 4G (including Long Term Evolution (LTE), LTE-Advanced, and LTE-Advanced Pro), 5G NR, Wireless Local Area Network (WLAN) (for instance, Wi-Fi), Wireless Personal Area Network (WPAN) (for instance, Bluetooth and ZigBee), Wireless Metropolitan Area Network (WMAN) (for instance, WiMax), and/or satellite-based radio navigation systems (for instance, Global Positioning System (GPS) technologies).

The transceiver 1004 can generate radio-frequency (RF) signals for transmission and process incoming RF signals received from the antennas 1008. It will be understood that various functionalities associated with the transmission and receiving of RF signals can be achieved by one or more components that are collectively represented in FIG. 10 as the transceiver 1004. In one example, separate components (for instance, separate circuits or dies) can be provided for handling certain types of RF signals.

The front end system 1006 can aid in conditioning signals transmitted to and/or received from the antennas 1008. In examples, the front end system 1006 can be implemented as a front end module (FEM). In the illustrated example, the front end system 1006 includes power amplifiers (PAS) 1028, low noise amplifiers (LNAs) 1030, filters 1032, switches 1034, and duplexers 1036. However, other implementations are possible. The fuse system 1022 can be included within any of the components 1028-1036.

The front end system 1006 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In examples, the radio-frequency device 1000 supports carrier aggregation, thereby providing flexibility to increase peak data rates. Carrier aggregation can be used for both Frequency Division Duplexing (FDD) and Time Division Duplexing (TDD), and can be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 1008 can include antennas used for a wide variety of types of communications. For example, the antennas 1008 can include antennas for transmitting and/or receiving signals associated with a wide variety of frequencies and communications standards. In examples, the antennas 1008 can transmit an amplified radio-frequency signal.

In examples, the antennas 1008 support Multiple-Input Multiple-output (MIMO) communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The radio-frequency device 1000 can operate with beamforming in certain implementations. For example, the front end system 1006 can include phase shifters having variable phase controlled by the transceiver 1004. Additionally, the phase shifters are controlled to provide beam formation and directivity for transmission and/or reception of signals using the antennas 1008. For example, in the context of signal transmission, the phases of the transmit signals provided to the antennas 1008 are controlled such that radiated signals from the antennas 1008 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 1008 from a particular direction. In certain implementations, the antennas 1008 include one or more arrays of antenna elements to enhance beamforming.

The baseband system 1002 is coupled to the user interface 1014 to facilitate processing of various user input and output (I/O), such as voice and data. The baseband system 1002 provides the transceiver 1004 with digital representations of transmit signals, which the transceiver 1004 processes to generate RF signals for transmission. The baseband system 1002 also processes digital representations of received signals provided by the transceiver 1004. As shown in FIG. 10, the baseband system 1002 is coupled to the memory 1012 of facilitate operation of the radio-frequency device 1000.

The memory 1012 can be used for a wide variety of purposes, such as storing data and/or instructions to facilitate the operation of the radio-frequency device 1000 and/or to provide storage of user information.

The power management system 1010 provides a number of power management functions of the radio-frequency device 1000. The power management system 1010 can provide power to any number of components of the radio-frequency device 1000. In examples, the power management system 1010 includes a PA supply control circuit that controls the supply voltages of the power amplifiers 1028. For example, the power management system 1010 can be configured to change the supply voltage(s) provided to one or more of the power amplifiers 1028 to improve efficiency, such as power added efficiency (PAE).

As shown in FIG. 10, the power management system 1010 receives a battery voltage from the battery 1016. The battery 1016 can be any suitable battery for use in the radio-frequency device 1000, including, for example, a lithium-ion battery.

The radio-frequency device 1000 can include a wide variety of devices that are configured to communicate wirelessly. For example, the radio-frequency device 1000 can include a cellular phone, a smart-phone, a hand-held wireless device with or without phone functionality, a wireless tablet, a wearable device, a smart appliance, a smart vehicle, etc.

Although the example of FIG. 10 discusses implementing one or more fuse systems within the context of a radio-frequency device 1000, the fuse systems can be implemented in various devices, such as a memory chip, a memory module, a circuit of optical network or another communication network, a disk driver circuit, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc.

The detailed description is set forth with reference to the accompanying figures. In the figures, the left-most digit(s) of a reference number identifies the figure in which the reference number first appears. The use of the same reference numbers in different figures indicates similar or identical items.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above description of embodiments of the disclosure is not intended to be exhaustive or to limit the disclosure to the precise form disclosed above. While specific embodiments, and examples, are described above for illustrative purposes, various equivalent modifications are possible within the scope of the disclosure, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel or at different times.

The features described herein can be applied to other systems, not necessarily the system described above. The elements and acts of the various embodiments described above can be combined to provide further embodiments.

While some embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. Claims and their equivalents are intended to cover such forms or modifications as would fall within the scope and spirit of the disclosure.

What is claimed is:

1. A fuse circuit comprising:
   a fuse;
   a first switch coupled to a first point and coupled in series with the fuse, the first switch being controllable to enable programming of the fuse, the first point is a shared power supply and fuse programming pad and the first switch is a first type of field-effect transistor, the shared power supply and fuse programming pad is configured to receive power for both fuse programming and powering components of a system in which the fuse circuit is included;
   a second switch coupled in series with the fuse between the fuse and a second point, the second switch being coupled to a first biasing circuit that is configured to control the second switch to enable programming of the fuse, the second point is a ground pad and the second switch is a second type of field-effect transistor; and
   a resistor coupled to the first biasing circuit and coupled between a gate of the second switch and the second point.

2. The fuse circuit of claim 1 further comprising a third switch coupled in series with the first switch between the first switch and the fuse, the third switch including a cascode field-effect transistor.

3. The fuse circuit of claim 2 further comprising a fuse protection capacitor coupled to a gate of the third switch and the first point to adjust a bias voltage of the third switch in response to a change in a voltage of the first point relative to a voltage of the second point.

4. The fuse circuit of claim 1 further comprising a diode coupled in series with the first switch.

5. The fuse circuit of claim 1 further comprising a fuse sensing circuit electrically connected to the fuse, the fuse sensing circuit being configured to detect a state of the fuse.

6. The fuse circuit of claim 1 further comprising a second biasing circuit configured to control the first switch.

7. The fuse circuit of claim 1 wherein the fuse is a first fuse and the fuse circuit further includes a third switch and a second fuse, the third switch being coupled in series with the second fuse, the third switch being controllable to enable programming of the second fuse.

8. The fuse circuit of claim 7 further comprising a fourth switch coupled in series with the second fuse between the second fuse and the second point, the fourth switch being controllable to enable programming of the second fuse.

9. The fuse circuit of claim 7 wherein the first and second fuses are coupled to a node and the second switch is coupled between the node and the second point.

10. A packaged module comprising:
    a packaging substrate; and
    a fuse circuit implemented on the packaging substrate, the fuse circuit including a diode, a first switch, a fuse, and a second switch, the first switch being coupled to a shared power supply and fuse programming pad, the fuse being coupled in series with the first switch, the second switch being coupled in series with the fuse between the fuse and a ground pad, the shared power supply and fuse programming pad is coupled to a power supply that provides power for both fuse programming and powering components on the packaging substrate, the diode being coupled in series with the first switch between the shared power supply and the fuse programming pad and the fuse.

11. The packaged module of claim 10 wherein the first switch and the second switch each include a field-effect transistor.

12. The packaged module of claim 10 wherein the first switch includes a first type of field-effect transistor and the second switch includes a second type of field-effect transistor.

13. A radio-frequency device comprising:
    a transceiver configured to generate a radio-frequency signal;
    a front end system in communication with the transceiver, the front end system being configured to amplify the radio-frequency signal;
    a power management system in communication with the transceiver, the power management system being configured to provide power for operation of the radio-frequency device;
    a fuse circuit implemented on a least one of the transceiver, the front end system, or the power management system, the fuse circuit including a first switch, a fuse, a second switch, and a resistor, the first switch is coupled to a first point and coupled in series with the fuse, the first switch is controllable to enable programming of the fuse, the first point is a shared power supply and fuse programming pad and the first switch is a first type of field-effect transistor, the shared power supply and fuse programming pad is configured to receive power for both fuse programming and powering components of the radio-frequency device, the second switch is coupled in series with the fuse between the fuse and a second point, the second switch is configured to couple to a first biasing circuit that is configured to control the second switch to enable programming of the fuse, the second point is a ground pad and the second switch is a second type of field-effect transistor, the resistor is configured to couple to the first biasing circuit and coupled between a gate of the second switch and the second point; and
    an antenna in communication with the front end system, the antenna being configured to transmit the amplified radio-frequency signal.

14. The radio-frequency device of claim 13 wherein the fuse circuit further includes a conductive path between the gate of the second switch and the ground pad.

15. The radio-frequency device of claim 13 wherein the fuse circuit further includes a third switch coupled in series with the first switch between the first switch and the fuse, the third switch including a cascode field-effect transistor.

16. The radio-frequency device of claim 15 wherein the fuse circuit further includes a fuse protection capacitor coupled to a gate of the third switch and the first point to adjust a bias voltage of the third switch in response to a change in a voltage of the first point relative to a voltage of the second point.

17. The radio-frequency device of claim 13 wherein the fuse circuit further includes a diode coupled in series with the first switch.

18. The radio-frequency device of claim 13 wherein the fuse circuit further includes a fuse sensing circuit electrically connected to the fuse, the fuse sensing circuit being configured to detect a state of the fuse.

19. The radio-frequency device of claim 13 wherein the fuse circuit further includes a second biasing circuit configured to control the first switch.

20. The radio-frequency device of claim 13 wherein the fuse is a first fuse and the fuse circuit further includes a third switch and a second fuse, the third switch being coupled in series with the second fuse, the third switch being controllable to enable programming of the second fuse.

* * * * *